US012334304B2

(12) United States Patent
Azad et al.

(10) Patent No.: US 12,334,304 B2
(45) Date of Patent: Jun. 17, 2025

(54) SYSTEM AND METHODS FOR IMPLEMENTING A MICRO PULSING SCHEME USING DUAL INDEPENDENT PULSERS

(71) Applicant: Applied Materials, Inc., Santa Clara, CA (US)

(72) Inventors: A N M Wasekul Azad, Santa Clara, CA (US); Kartik Ramaswamy, San Jose, CA (US); Yue Guo, Redwood City, CA (US); Nicolas J. Bright, Arlington, WA (US); Yang Yang, San Diego, CA (US)

(73) Assignee: Applied Materials, Inc., Santa Clara, CA (US)

( * ) Notice: Subject to any disclaimer, the term of this patent is extended or adjusted under 35 U.S.C. 154(b) by 213 days.

(21) Appl. No.: 18/059,658

(22) Filed: Nov. 29, 2022

(65) Prior Publication Data

US 2024/0177968 A1    May 30, 2024

(51) Int. Cl.
*H01L 21/67*    (2006.01)
*H01J 37/32*    (2006.01)

(52) U.S. Cl.
CPC .. *H01J 37/32146* (2013.01); *H01J 37/32128* (2013.01); *H01J 37/32137* (2013.01); *H01J 37/32174* (2013.01)

(58) Field of Classification Search
CPC .......... H01J 37/32146; H01J 37/32128; H01J 37/32137; H01J 37/32174; H01J 37/32155; H01J 37/32165; H01J 37/32183

See application file for complete search history.

(56) References Cited

U.S. PATENT DOCUMENTS

2008/0182418 A1*  7/2008  Collins ............. C23C 16/45574
                                                438/729
2013/0213573 A1*  8/2013  Valcore, Jr. ............... H02J 3/00
                                                156/345.44

(Continued)

FOREIGN PATENT DOCUMENTS

EP        3457428 A1    3/2019
JP     2019036658 A     3/2019

(Continued)

OTHER PUBLICATIONS

International Search Report/ Written Opinion issued to application No. PCT/US2023/078401 on Feb. 23, 2024.

*Primary Examiner* — Luz L Alejandro Mulero
(74) *Attorney, Agent, or Firm* — Patterson + Sheridan, LLP (57) ABSTRACT

Embodiments of the disclosure provided herein include an apparatus and method for processing a substrate in a plasma processing system. The apparatus includes a pulse voltage (PV) waveform generator comprising at least one synchronization signal and a plurality of pulsers to provide a plurality of TTL inputs. The PV waveform generator generates a waveform containing pulses or bursts which contain micropulses corresponding to the plurality of TTL input signals and the at least one synchronization signal. The method includes receiving a first TTL input signal and a synchronization waveform signal from a controller, delivering a first micropulse to an electrode assembly after receiving the first TTL input signal and synchronization signal, and delivering a second micropulse to the electrode assembly after receiving the second TTL input signal and the synchronization signal.

19 Claims, 6 Drawing Sheets

(56) References Cited

U.S. PATENT DOCUMENTS

| | | | |
|---|---|---|---|
| 2014/0302682 A1* | 10/2014 | Muto | H01J 37/32146 438/711 |
| 2020/0058470 A1* | 2/2020 | Ventzek | H01L 21/67069 |
| 2022/0037121 A1 | 2/2022 | Dorf et al. | |

FOREIGN PATENT DOCUMENTS

| | | | |
|---|---|---|---|
| KR | 102222902 B1 | 3/2021 | |
| WO | WO-2019040949 A1 * | 2/2019 | H01J 37/32128 |
| WO | 2022072234 A1 | 4/2022 | |

* cited by examiner

SYSTEM AND METHODS FOR IMPLEMENTING A MICRO PULSING SCHEME USING DUAL INDEPENDENT PULSERS

BACKGROUND

Field

Embodiments of the present invention generally relate to a system and method for controlling the delivery of power to a plasma formed in plasma processing chamber used in semiconductor manufacturing.

Description of the Related Art

Reliably producing high aspect ratio features is one of the key technology challenges for the next generation of semiconductor devices. One method of forming high aspect ratio features uses a plasma-assisted etching process to bombard a material formed on a surface of a substrate through openings formed in a patterned mask layer formed on the substrate surface.

With technology nodes advancing towards 2 nm, the fabrication of smaller features with larger aspect ratios requires atomic precision for plasma processing. For etching processes where the plasma ions play a major role, ion energy control is always challenging the development of reliable and repeatable device formation processes in the semiconductor equipment industry. In a typical plasma-assisted etching process, the substrate is positioned on an electrostatic chuck (ESC) disposed in a processing chamber, a plasma is formed over the substrate, and ions are accelerated from the plasma towards the substrate across a plasma sheath, i.e., region depleted of electrons, formed between the plasma and the surface of the substrate.

Traditionally radio frequency (RF) substrate biasing methods, which use sinusoidal RF waveforms to excite the plasma and form the plasma sheath, have been unable to desirably form these smaller device feature sizes. Recently, it has been found that the delivery of high voltage pulses to one or more electrodes within a processing chamber can be useful in desirably controlling the plasma sheath formed over the surface of the substrate. However, producing moderate to high frequency high voltage pulses is challenging. Such pulse may be especially difficult to produce using standard electrical components due to the heating of switching components used to form the high voltage pulses.

Accordingly, there is a need in the art for pulsed voltage source and biasing methods that are able to enable the completion of a desirable plasma-assisted process on a substrate.

SUMMARY

Embodiments described herein generally relate to systems and methods used for controlling the delivery of power to a plasma formed in plasma processing chamber used in semiconductor manufacturing. More particularly, embodiments herein provide pulsed voltage source and biasing methods that are able to enable the completion of a desirable plasma-assisted process on a substrate.

In an embodiment, a substrate processing system is provided. In this embodiment, the substrate processing system includes a substrate support assembly disposed within a processing chamber, an electrode disposed within the substrate support assembly, a pulse voltage waveform generator configured to deliver a pulse voltage waveform to the electrode, and a controller coupled to the pulse voltage waveform generator. The controller comprises a plurality of pulsers and at least one synchronization pulser that is configured to transmit a synchronization signal. The plurality of pulsers comprises a first pulser configured to provide a first TTL input signal and a second pulser configured to provide a second TTL input and the pulse voltage waveform comprises a plurality of pulse voltage micropulses.

In another embodiment, a method for processing a substrate in a plasma processing system is provided. In this embodiment, the method includes receiving, by a waveform generator, a first TTL input signal from a first pulser of a plurality of pulsers and a synchronization waveform signal from a controller, then delivering, by the waveform generator, a first pulse voltage micropulse to an electrode disposed in a substrate support assembly within the plasma processing system after receiving the first TTL input signal and the synchronization signal. The method further includes receiving, by the waveform generator, a second TTL input signal from a second pulser of the plurality of pulsers and the synchronization signal from the controller before delivering, by the waveform generator, a second pulse voltage micropulse to the electrode disposed in a substrate support assembly within the plasma processing system after receiving the second TTL input signal and the synchronization signal. The first pulse voltage micropulse comprises a plurality of first pulse voltage micropulses, the second pulse voltage micropulse comprises a plurality of second pulse voltage micropulses, and each of the plurality of second pulse voltage micropulses interleaved between each of the plurality of first pulse voltage micropulses.

In yet another embodiment, a processing system is provided. In this embodiment, the processing system includes a processing chamber, a voltage waveform generator configured to deliver a pulsed voltage waveform to an electrode assembly disposed within the processing chamber, a controller, and a memory for storing a program to be executed in the controller. The program comprises instructions that cause the voltage waveform generator to: receive, by a waveform generator, a first TTL input signal from a first pulser of a plurality of pulsers and a synchronization waveform signal from the controller, deliver, by the waveform generator, a first micropulse to an electrode disposed in a substrate support assembly within the plasma processing system after receiving the first TTL input signal and the synchronization signal.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of the scope of the disclosure, as the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the disclosure provided herein include an apparatus and method for the plasma processing of a substrate in a processing chamber. More specifically, embodiments of this disclosure describe a biasing scheme that is configured to provide a radio frequency (RF) generated RF waveform from an RF generator to one or more electrodes within a processing chamber and a pulsed-voltage (PV) waveform delivered from one or more pulsed-voltage (PV) generators to the one or more electrodes within the processing chamber.

In general, the generated RF waveform is configured to establish and maintain a plasma within the processing chamber, and the delivered PV waveforms are configured to establish a desired sheath voltage across the surface of a substrate during one or more phases of a plasma process and thus create a desirable ion energy distribution function (IEDF) and electron energy distribution function (EEDF) at the surface of the substrate during the one or more plasma processing phases performed on the substrate within the processing chamber. The plasma processes disclosed herein can be used to control the shape of IEDF and EEDF and thus the interaction of the plasma with a surface of a substrate during processing. In some configurations, the plasma processes disclosed herein are used to control the profile of features formed in the surface of the substrate during processing. In some embodiments, the pulsed voltage waveform is established by a PV generator that is electrically coupled to a biasing electrode disposed within a substrate support assembly disposed within a plasma processing chamber.

Figure 1:
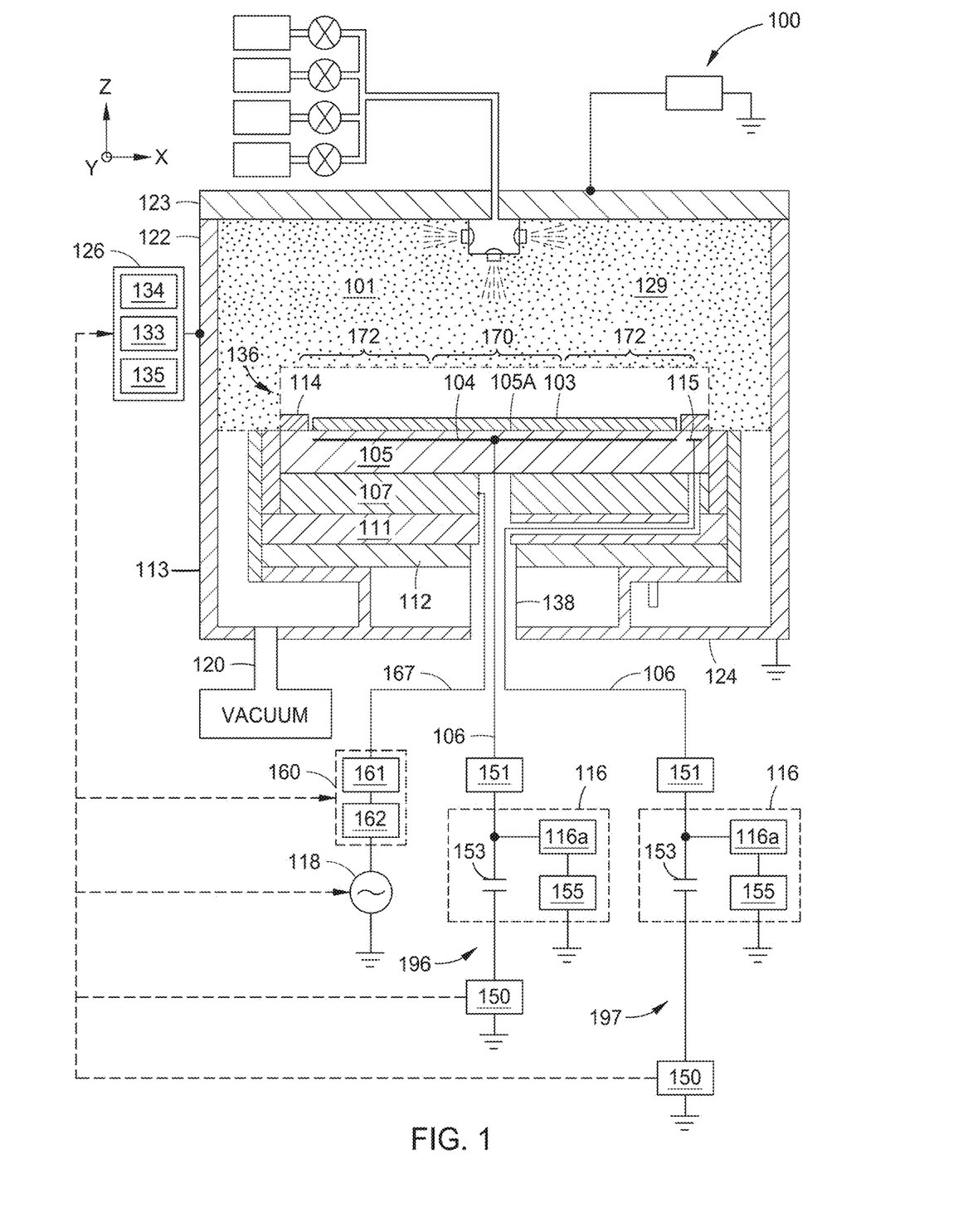
FIG. 1 is a schematic cross-sectional view of a processing chamber according to certain embodiments.

FIG. 1 illustrates a plasma processing system 100 according to certain embodiments. The processing system 100 generally includes a processing chamber 113 having a chamber lid 123, a chamber base 124, and chamber walls 122 enclosing a processing volume 129. A substrate support assembly 136 is disposed within the processing volume 129 and is configured to receive and support a substrate 103 positioned thereon. As shown in FIG. 1, during some semiconductor plasma processes, ions are purposely accelerated towards the substrate 103 by the voltage drop in an electron-repelling sheath that forms over the substrate 103 placed on top of the substrate-support assembly 136 disposed in the processing volume 129 of the processing chamber 113. While not intending to be limiting as to the scope of the disclosure provided herein, the substrate support assembly 136 is often referred to herein as the "cathode assembly" or "cathode". In some embodiments, the substrate support assembly 136 includes a substrate support 105 and a support base 107. The substrate support 105 can include an electrostatic chuck (ESC) assembly that is configured to chuck (e.g., retain) a substrate on a substrate receiving surface 105A.

In some embodiments of the disclosure provided herein, the processing chamber 113 is configured to provide a capacitively coupled gas discharge, such that a plasma 101 is created by use of an RF generator 118 that is coupled to an RF electrode (e.g., the support base 107) through an RF matching network 162. The RF matching network 162 is configured to tune the apparent load to minimize the reflected power and maximize the power delivery efficiency. In some embodiments, the RF electrode includes a metal plate (not shown) that is positioned parallel to the plasma-facing surface of the substrate.

Additionally, during the plasma processing methods disclosed herein, an ion-accelerating cathode sheath is generally formed during plasma processing by use of a pulsed-voltage (PV) waveform generator 150 that is configured to establish a pulsed-voltage waveform at one or more biasing electrodes 104 disposed within the substrate support assembly 136. In some embodiments, the one or more biasing electrodes 104 are separated from the substrate 103 by a thin layer of a dielectric material formed within the substrate support assembly 136 (e.g., electrostatic chuck (ESC) assembly) and optionally include an edge control electrode 115 that is disposed within or below an edge ring 114 that surrounds the substrate 103 when the substrate 103 is disposed on the substrate supporting surface 105A of the substrate support assembly 136. In some embodiments, the biasing electrode 104 is electrically coupled to a bias compensation module 116, which provides a chucking voltage thereto, such as static DC voltage between about −5000 V and about 5000 V, using an electrical conductor, such as the coaxial transmission line 106 (e.g., a coaxial cable). The high voltage module 116 includes bias compensation circuit elements 116a, a DC power supply 155, a second filter assembly 151, and a blocking capacitor 153. A bias compensation module blocking capacitor, which is also referred to herein as the blocking capacitor 153, is disposed between the output of a PV waveform generator 150 and the biasing electrode 104.

The edge control electrode 115 can be biased by use of a PV waveform generator 150 that may be different from the PV waveform generator 150 that is used to bias the biasing electrode 104. In one configuration, a first PV waveform generator 150 of a first PV source assembly 196 is configured to bias the biasing electrode 104, and a second PV waveform generator 150 of a second PV source assembly 197 is configured to bias the edge control electrode 115.

As discussed above, in some embodiments, the RF generator 118 and an RF generator assembly 160 are generally configured to deliver a desired amount of a continuous wave (CW) or pulsed RF power at a desired substantially fixed sinusoidal waveform frequency to the support base 107 of the substrate support assembly 136 based on control signals provided from a system controller 126.

The controller 126 herein includes a central processing unit (CPU) 133, a memory 134, and support circuits 135. The controller 126 is used to control the process sequence used to process the substrate 103 including the substrate biasing methods described herein. The CPU 133 is a general-purpose computer processor configured for use in an industrial setting for controlling processing chamber and sub-processors related thereto. The memory 134 described herein, which is generally non-volatile memory, may include random access memory, read only memory, floppy or hard disk drive, or other suitable forms of digital storage, local or remote. The support circuits 135 are conventionally coupled to the CPU 133 and comprise cache, clock circuits, input/output subsystems, power supplies, and the like, and combinations thereof. Software instructions (program) and data can be coded and stored within the memory 134 for instructing a processor within the CPU 133. A software program (or computer instructions) readable by CPU 133 in the controller 126 determines which tasks are performable by the components in the plasma processing chamber 100. Preferably, the program, which is readable by CPU 133 in the controller 126, includes code, which when executed by the processor (CPU 133), perform tasks relating to the monitoring and execution of the electrode biasing scheme described herein. The program will include instructions that are used to control the various hardware and electrical components within the plasma processing chamber 100 to perform the various process tasks and various process sequences used to implement the electrode biasing scheme described herein.

During processing, the RF generator 118 and the RF generator assembly 160 are configured to deliver RF power (e.g., an RF signal) to the support base 107 disposed proximate to the substrate support 105, and within the substrate support assembly 136. The RF power delivered to the support base 107 is configured to ignite and maintain the processing plasma 101 of processing gases disposed within the processing volume 129. In some embodiments, the RF generator 118 is configured to deliver an RF signal having a frequency that is greater than 1 MHz or more, or about 2 MHz or more, such as about 13.56 MHz or more.

In some embodiments, the support base 107 is the RF electrode that is electrically coupled to the RF generator 118 via an RF power delivery line 167, the RF matching circuit 162, and a first filter assembly 161, which are both disposed within the RF generator assembly 160. The first filter assembly 161 includes one or more electrical elements that are configured to substantially prevent a current generated by the output of the PV waveform generator 150 from flowing through the RF power delivery line 167 and damaging the RF generator 118. The first filter assembly 161 acts as a high impedance to the PV signal generated from a PV pulse generator P1 within the PV waveform generator 150, and thus inhibits the flow of current to the RF matching circuit 162 and RF generator 118.

In some embodiments, the RF generator assembly 160 and RF generator 118 are used to ignite and maintain the processing plasma 101 using the processing gases disposed in the processing volume 129 and fields generated by the RF power (RF signal) delivered to the support base 107 by the RF generator 118. The processing volume 129 is fluidly coupled to one or more dedicated vacuum pumps through a vacuum outlet 120, which maintain the processing volume 129 at sub-atmospheric pressure conditions and evacuate processing or other gases, therefrom. In some embodiments, the substrate support assembly 136, disposed in the processing volume 129, is disposed on a support shaft 138 that is grounded and extends through the chamber base 124. However, in some embodiments, the RF generator assembly 160 is configured to deliver an RF power to the bias electrode 104 disposed in the substrate support 105 versus the support base 107.

The substrate support assembly 136, as briefly discussed above, generally includes the substrate support 105 (e.g., ESC substrate support) and the support base 107. In some embodiments, the substrate support assembly 136 can additionally include an insulator plate 111 and a ground plate 112, as is discussed further below. The support base 107 is electrically isolated from the chamber base 124 by the insulator plate 111, and the ground plate 112 is interposed between the insulator plate 111 and the chamber base 124. The substrate support 105 is thermally coupled to and disposed on the support base 107. In some embodiments, the support base 107 is configured to regulate the temperature of the substrate support 105, and the substrate 103 disposed on the substrate support 105, during substrate processing.

Figure 2:
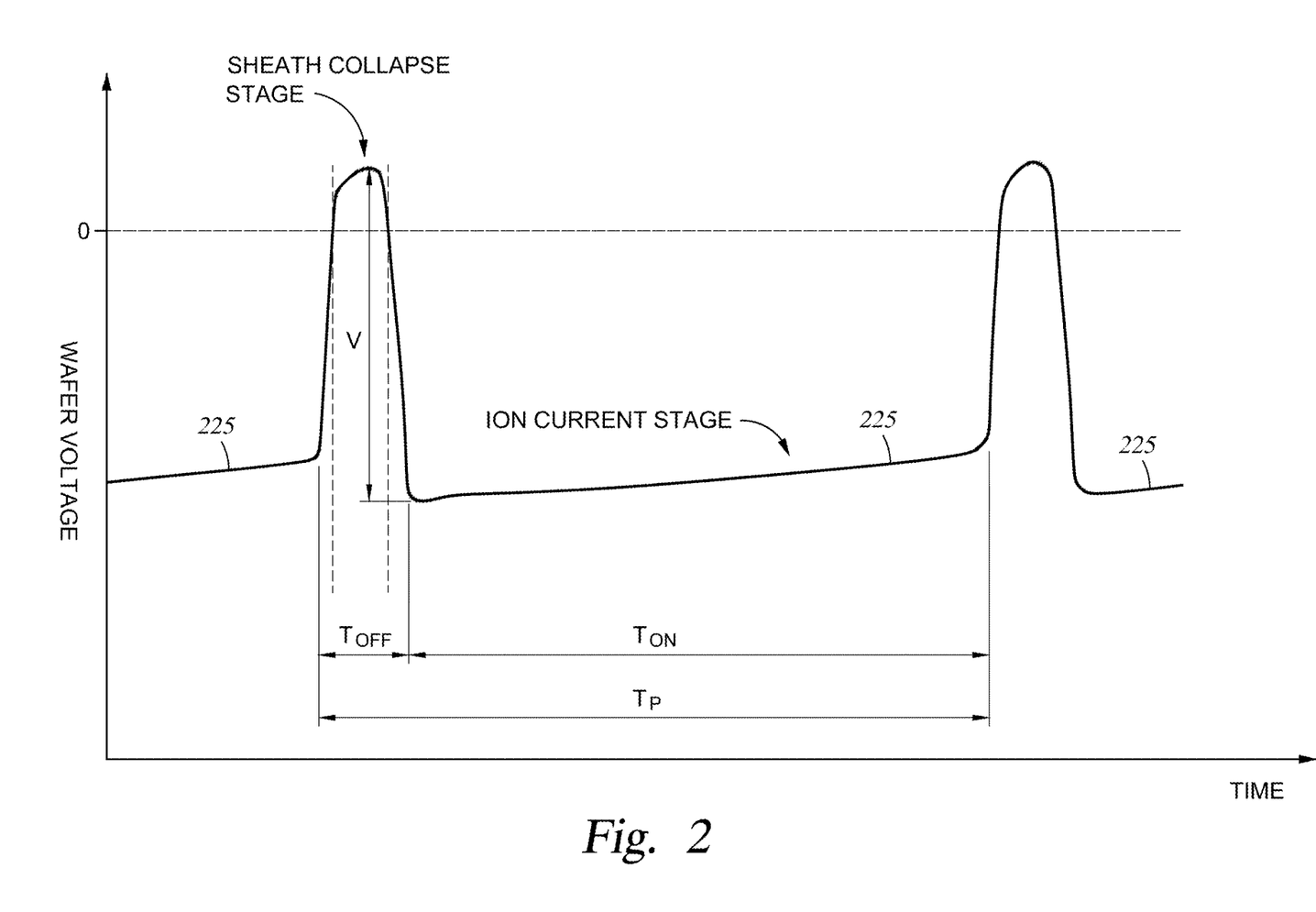
FIG. 2 illustrates an example of a pulsed voltage waveform that includes voltage pulses provided within the pulsed voltage waveform that is established at a substrate due to the delivery of voltage pulses to a bias electrode during plasma processing by use of a PV waveform generator, according to certain embodiments.

FIG. 2 illustrates an example of a pulsed voltage waveform that includes voltage pulses provided within the pulsed voltage waveform that is established at a substrate due to the delivery of voltage pulses to the bias electrode 104 during plasma processing by use of the PV waveform generator 150, according to certain embodiments. It has been found that the establishment of the PV waveforms to a substrate during plasma processing can be advantageously used to control aspects of the plasma sheath formed over the surface of the substrate during plasma processing. The control of the magnitude and shape of plasma sheath formed over the surface of the substrate allows the control of the ion interaction with the surface of the substrate during processing, such as allowing the control of the ion energy distribution function (IEDF), electron energy distribution function (EEDF), ion directionality, and other plasma related characteristics.

In FIG. 2, waveform 225 includes two main stages: an ion current stage and a sheath collapse stage. Both the ion current stage and the sheath collapse stage of the waveform 225 can be established at the substrate 103 during plasma processing. At the beginning of the ion current stage, a drop in voltage at the substrate 103 is created, due to the delivery of a negative portion of a PV waveform (e.g., ion current portion) provided to the bias electrode 104 by the PV waveform generator 150, which creates a high voltage sheath above the substrate 103. The high voltage sheath allows the plasma generated positive ions to be accelerated towards the biased substrate during the ion current stage, and thus, for reactive ion etching (RIE) processes, controls the amount and characteristics of the etching process that occurs on the surface of the substrate during plasma processing. In some embodiments, it is desirable for the ion current stage to generally include a region of a pulsed voltage waveform that achieves a voltage at the substrate that is stable or minimally varying throughout the stage. Significant variations in voltage established at the substrate during the ion current stage, such as shown by the positive slope in the waveform 225, will undesirably cause a variation in the IEDF or EEDF, and thus, cause undesirable characteristics of the etched features to be formed in the substrate during an RIE process.

In some implementations, due to system complexity and equipment cost related issues, positive ion current is not compensated for during the ion current stage of the voltage waveform, and therefore, the negative voltage on the substrate decays with time (e.g., becoming less negative). Waveform 225 is an example of a non-compensated pulsed PV waveform established at the substrate 103 during plasma processing due to the delivery of a PV waveform provided to the bias electrode 104. Without compensation, the substrate voltage rises during the ion current stage, also referred to herein as a voltage droop. The voltage droop worsens with increasing plasma density (e.g., increasing ion current) which causes the ion energy distribution (IED) to expand towards the lower energy regime.

In some cases, a ramp voltage is generated to compensate for this voltage rise during portions of the ion current stage, by use of a current source or a plurality of voltage sources that are coupled to the electrode (e.g., electrode 104). The compensated PV waveform seen at the substrate can alternatively be established by applying a negative voltage ramp to a PV waveform provided to the bias electrode 104 by the PV waveform generator 150 during the ion current stage of the pulsed voltage waveform. However, at higher voltages (e.g., greater than 5 kV), it is challenging to generate custom waveforms with a ramp to compensate for this voltage rise.

In some embodiments, a high frequency voltage waveform may be used to lessen the impact of this voltage rise (i.e., droop) created during the ion current stage. Generating high frequency voltage pulse trains at pulse repetition frequencies or pulse switch frequencies greater than 400 kHz is problematic, due to physical and practical device limitations. Therefore, switching speeds for conventional high voltage switches are limited to a maximum practical switching speed to avoid damage caused by heat generated during use at moderate to high frequencies. In certain embodiments of the present disclosure, interleaving of voltage pulses is used to generate a waveform to be provided to a complex load (e.g., the electrostatic chuck and plasma 101) such that the load receives pulses at a higher frequency, mitigating the effects of the voltage droop at the substrate surface. For example, positive voltage pulses at a frequency of around 400 kHz may be used to periodically establish a negative direct current (DC) bias on the substrate, thereby obtaining IEDs with a mono-energy peak. As the voltage at the substrate surface rises to a specific threshold during the ion current stage of a first voltage waveform pulse, a second voltage waveform pulse (e.g., from a different source or switches) may be applied, resetting the voltage at the substrate surface during a following pulse cycle, as described in more detail herein.

A PV waveform generated by the PV waveform generator 150 may include a plurality of bursts (not shown). Each burst is made up of a pulsed voltage waveform that includes a plurality of asymmetric voltage pulses. In some embodiments, the bias voltage is applied during each asymmetric voltage pulse during the ion current stage. Stated otherwise the off-time $T_{off}$ of each voltage pulse occurs during the sheath collapse stage and the application of the bias voltage is applied during the on-time $T_{on}$, which occurs during the ion current stage. The on-time $T_{on}$ and the off-time $T_{off}$ are configured as a percentage of a period $T_P$ of each voltage pulse. The frequency of each voltage pulse may be adjusted by increasing or decreasing $T_P$, while on-time $T_{on}$ and off-time $T_{off}$ may be adjusted by changing their percentages of $T_P$. Furthermore, the voltage pulse has an applied voltage V that is defined as the peak voltage of the sheath collapse stage.

Figure 3A:
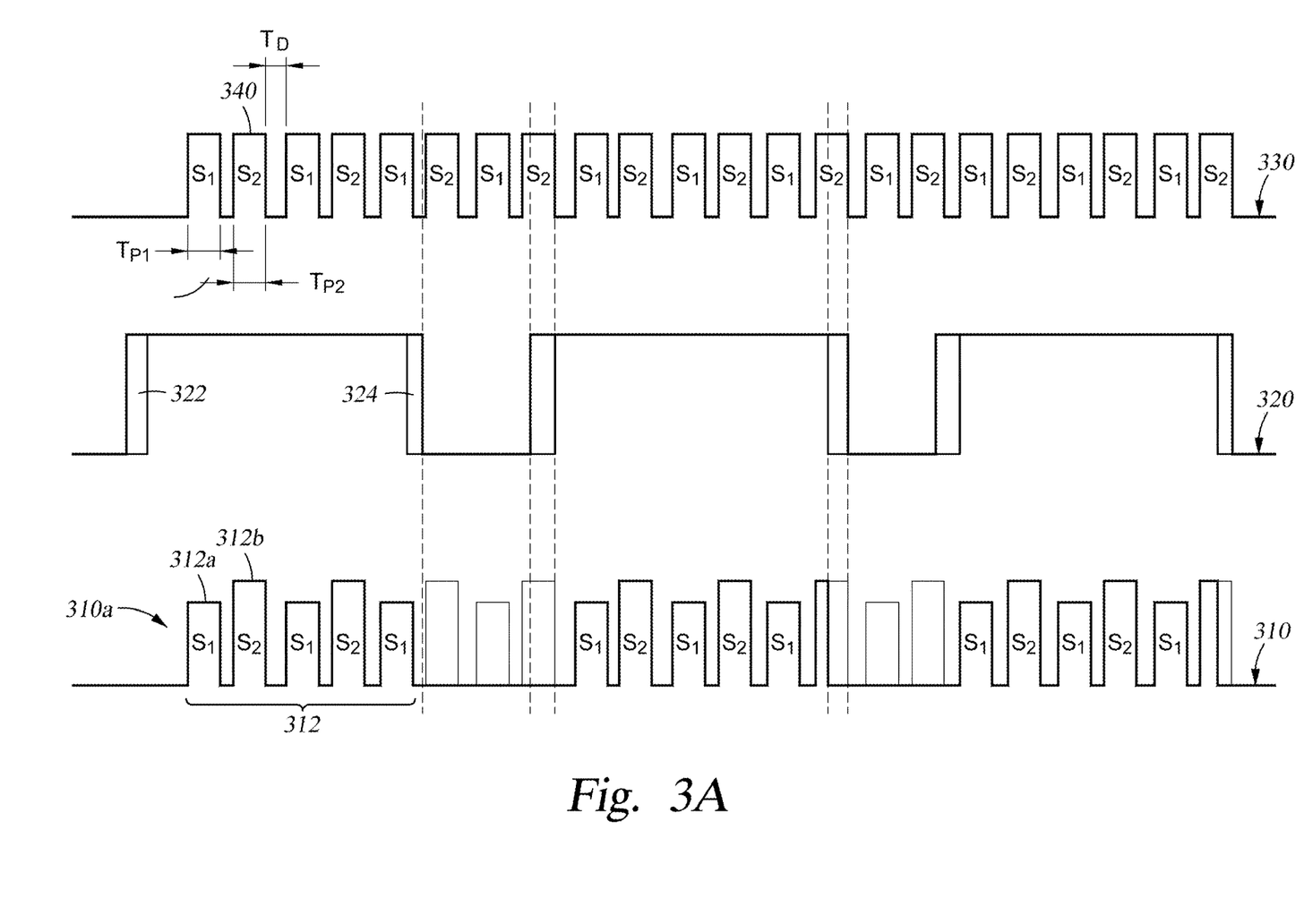
FIG. 3A illustrates a voltage pulse waveform according to certain embodiments

FIG. 3A illustrates pulses of a PV waveform generated by the PV waveform generator 150 delivered to the bias electrode 104, according to certain embodiments. The PV waveform generator 150 is configured to generate a PV waveform 310 comprising a plurality bursts of voltage pulses (e.g., 310a) that are based on information provided in a parameter of a synchronization signal 320, a first transistor-transistor logic (TTL) input signal 330, and a second TTL 340 input signal provided by the controller 126. The characteristics of the voltage pulses within a burst of voltage pulses generated by the PV waveform generator 150 are controlled by the synchronization signal 320 and the first and second TTL input signals 330 and 340 from pulsers 470 (FIG. 4). In some embodiments, at least one parameter of the voltage pulses within a burst are based on a parameter of the synchronization signal 320. In one example, a burst 310a may comprise a plurality of micropulses 312 (e.g., 312a and 312b) corresponding to the first and second TTL input signals 330 and 340. For clarity, the characteristics of the first TTL input signal 330 and the corresponding micropulse 312a have been labeled $S_1$ and the characteristics of the second TTL input signal 340 and the corresponding micropulse 312b have been labeled $S_2$ in FIGS. 3A and 3B.

In some embodiments, a burst is transmitted during each waveform pulse of the synchronization signal 320. At least one parameter of the asymmetric voltage pulses that makeup each burst, such as the burst frequency, the pulse on-time, the pulse voltage, and combinations thereof may be based on a parameter of each waveform pulse of the synchronization signal 320. In some embodiments, to adapt to the variations in the IEDF, EEDF, and undesirable characteristics, such as non-uniformity of etched features, the PV waveform generator 150 may be configured to deliver bursts with different parameters based on one or more characteristics of a synchronization signal 320 received by a PV waveform generator 150 from the controller 126. Advantageously, controlling the characteristics of portions of the pulsed voltage waveform during different phases of plasma process performed on the substrate 103 will allow for improved etched features to be formed across a surface of the substrate 103. For example, a higher voltage pulse frequency within a burst can result in a higher etch uniformity at a center portion 170 (FIG. 1) of the substrate 103 while a lower voltage pulse frequency during a burst can result in a lower etch uniformity at the edge portions 172 of the substrate 103. In another example, a longer pulse-on-time versus pulse off-time can result in an higher etch rate on the edge portions 172 of the substrate 103 and a shorter pulse-on time results in a lower etch rate on the center portion 170 of the substrate 103. It has been found that the pulse frequency can affect other important plasma processing parameters, such as etch selectivity. In another example, controlling the pulse voltage level, such as a higher voltage level in one phase of the plasma process versus another can result in an improved ability to etch deep features in a surface of the substrate, a higher etch rate and a larger plasma sheath (and vice versa for a pulse rate), while lower voltage levels can be beneficially used for forming certain types of etched features. In another example, adjusting the rest time between bursts of voltage pulses can be used to provide an extra time for the etching by-products to be pumped out of the processing volume 129, which can improve etch uniformity, while a shorter rest time between bursts can improve substrate throughput during plasma processing. Therefore, in each of the methods described below, at least one parameter of the voltage pulse within different bursts within a PV waveform may be adjusted during processing to achieve a desired plasma processing result. The combinations of different bursts that have voltage pulses that have differing characteristics can be used tune the plasma processing results seen on a substrate.

At least one parameter of each voltage waveform within a burst may be based on a parameter of each waveform pulse of the synchronization signal 320. The parameter of each waveform pulse of the synchronization signal 320 may correspond to one, all of, or a combination of parameters that are applied to a voltage pulse within a burst. Furthermore, multiple synchronization signals that each correspond to different parameters of each burst may also be used to differentiate between the characteristics applied to each voltage pulse within a burst.

In some embodiments, the synchronization signal 320 includes a pulse-on delay (POD) 322, a pulse-end delay (PED) 324, or both. The POD 322 allows for a diode generator to ramp-up prior to processing. The PED 324 allows for other substrate processing operations to occur between bursts 310.

In some embodiments, the first TTL input signal 330 and the second TTL input signal 340 correspond to a first pulser 470a and a second pulser 470b (FIG. 4), respectively. The first and second TTL input signals 330 and 340 allow respective signals with individual amplitudes and durations (e.g., $T_{p1}$ and $T_{p2}$). The first and second TTL input signals 330 and 340 allow signals from the first pulser 470a and the second pulser 470b to be received sequentially, or interleaved between each other, with a specified off time or "dead time" ($T_D$) resulting in multiple micropulses 312 of different amplitudes and durations within each burst 310. Interleaving micropulses 312 from different pulsers (e.g., first pulser 470a and second pulser 470b) results in switching frequencies faster than the switching frequency limitation of the individual pulsers, such as frequencies greater than 400 kHz in the case of MOSFET-based pulsers.

The combination of the interleaved TTL input signals (e.g., 330 and 340) and the synchronization signal (e.g., 320) results in the PV waveform 310 having multiple tuning knobs for substrate processing.

Advantageously, based on the etch recipe and desired etched features to be formed on the substrate 103, the synchronization signal 320 may be configured so that the parameters of the PV waveform 310 are changed during processing to achieve a desired etch profile across the substrate 103. Stated otherwise, although the waveform pulses alternate in FIG. 3A, the synchronization signal 320 may be configured to control the delivery of voltage pulses within each burst can in any suitable order or arrangement to meet a desired etch profile.

Furthermore, the rest time between bursts of the PV waveform 310 may correspond to the rest time between waveform pulses of the synchronization signal 320, the first TTL input signal 330, and the second TTL input signal 340. For example, the PV waveform will not output a burst without a TTL input signal (e.g., 330 or 340) and the synchronization signal 320. Further, the PV waveform will not output a pulse during the POD 322 or PED 324 of the synchronization signal 320.

Although bursts generated based on two different pulsers are illustrated in FIG. 3A, the number of pulsers generating different TTL input signals are not intended to be limited by this disclosure. Each characteristic of each voltage waveform within a burst may be controlled by use of one or more synchronization signals.

Figure 3B:
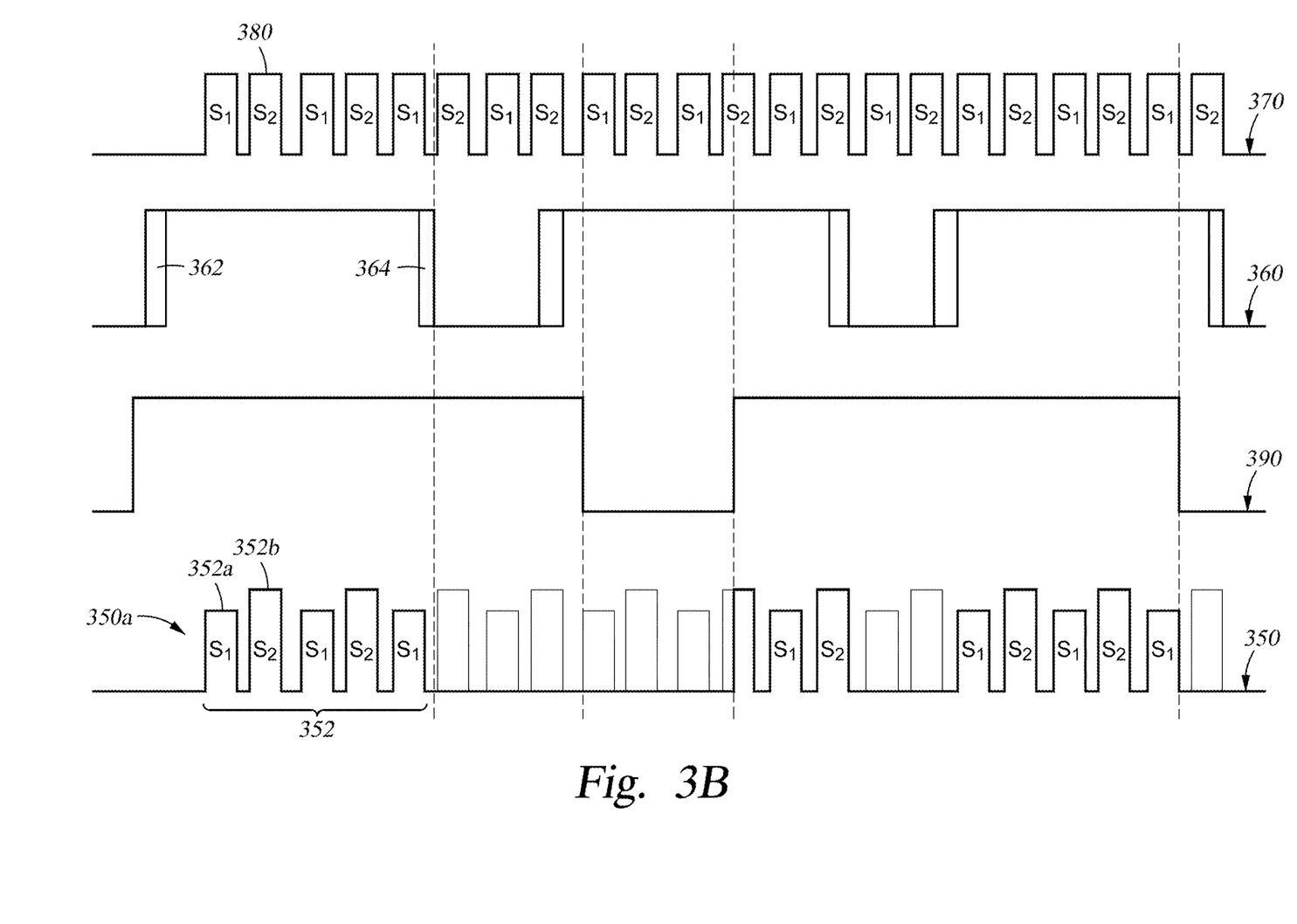
FIG. 3B illustrates a voltage pulse waveform according to certain embodiments
Figure 4:
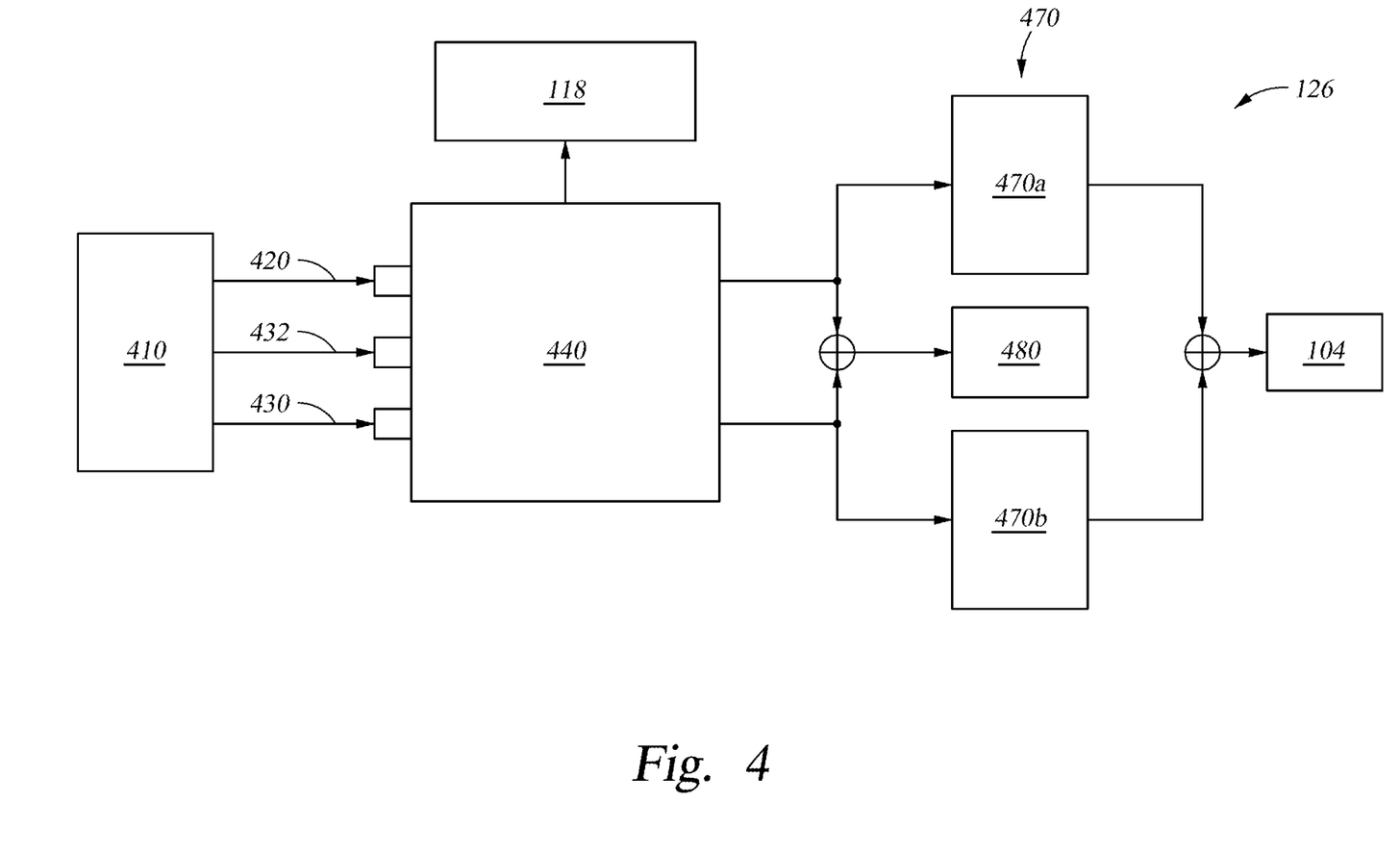
FIG. 4 is a schematic diagram of a connection according to certain embodiments.

FIG. 3B illustrates an embodiment of the present disclosure with two synchronization signals (e.g., a first synchronization signal 360 and a second synchronization signal 390). A PV waveform 350 is configured similarly to PV waveform 310 and comprises a plurality of bursts of voltage pulses (e.g., 350a) with a plurality micropulses 352 (e.g., 352a and 352b) corresponding to a first TTL input signal 370 and a second TTL input signal 380. The first synchronization signal 360 comprises a POD 362 and a PED 364. In FIG. 3B, the second synchronization signal 390 does not comprise a POD or PED, but may optionally comprise a POD, PED, or both. As shown in FIG. 3B, a burst 350a is transmitted during each waveform pulse of the first synchronization signal 360 (excluding POD 362 and PED 364) that overlaps with a waveform pulse of the second synchronization signal 390.

FIG. 4 illustrates a connection diagram for the controller 126. As shown, the controller 126 may comprise a software interface 410 connected to a logic board 440 through pulsers 420, 430, and 432. The logic board 440 is configured to deliver a synchronization pulse 450 (320 in FIG. 3A) to an RF generator 118. The logic board 440 is coupled to a plurality of pulsers 470 (e.g., the first pulser 470a and the second pulser 470b) configured to deliver a plurality of TTL input signal signals (e.g., first TTL input signal 330 and second TTL input signal 340) and a dante match 480. The pulsers 470 are then coupled to the bias electrode 104.

Figure 5:
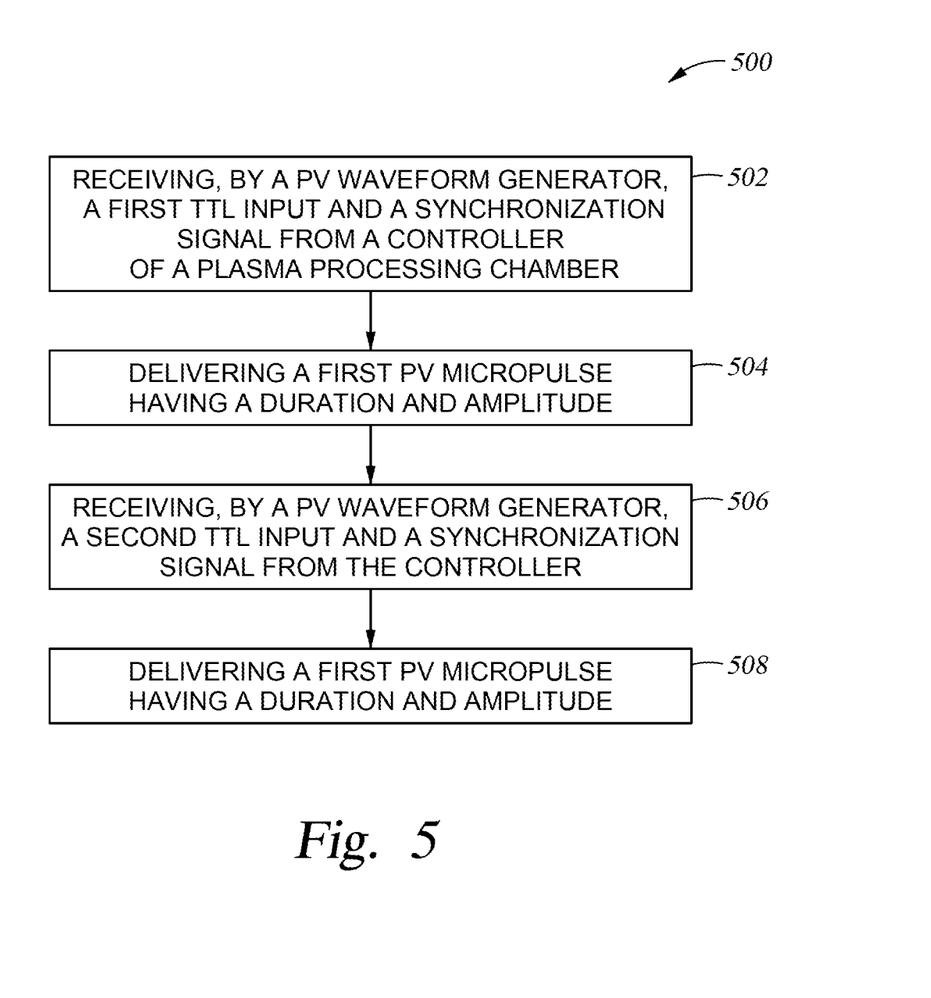
FIG. 5 illustrates a method of using a plasma processing chamber according to certain embodiments.

FIG. 5 is a process flow diagram illustrating a method 500 for waveform generation. The method 500 may be performed by a waveform generation system including a waveform generator, such as the waveform generator 150, and a system controller such as the system controller 126.

The method 500 begins at activity 502, with receiving, by a PV waveform generator, a first TTL input signal (e.g., first TTL input signal 330) and a synchronization signal (e.g., synchronization signal 320) from a controller (e.g., controller 126) of a plasma processing chamber (e.g., plasma processing chamber 100). At activity 504, the PV waveform generator delivers a first PV micropulse (e.g., 312a) having a duration and amplitude.

At activity 506, the PV waveform generator receives a second TTL input signal (e.g., second TTL input signal 340) and a synchronization signal (e.g., synchronization signal 320) from the controller.

At activity 508, the PV waveform generator delivers a second PV micropulse (e.g., 312b) having a duration and amplitude. The duration, amplitude, or both of the second PV micropulse may be equal to the duration, amplitude, or both of the first PV micropulse. Alternatively, the duration, amplitude, or both of each of the first PV micropulse and the second PV micropulse may be different. For example, the duration of the first PV micropulse may be equal to the duration of the second PV micropulse, but the respective amplitudes may be different.

The first PV micropulse may be a plurality of first PV micropulses and the second PV micropulse may be a plurality of second PV micropulses. Each of the second PV micropulses in the plurality of second PV micropulses may sequentially follow, or interleave, each of the first PV micropulses of the plurality of first PV micropulses. This allows for micropulses to be delivered from alternating TTL input signals overcoming the switching frequency limitation of individual pulsers.

The term "coupled" is used herein to refer to the direct or indirect coupling between two objects. For example, if object A physically touches object B and object B touches object C, then objects A and C may still be considered coupled to one another-even if objects A and C do not directly physically touch each other. For instance, a first object may be coupled to a second object even though the first object is never directly physically in contact with the second object.

While the foregoing is directed to embodiments of the present disclosure, other and further embodiments of the disclosure may be devised without departing from the basic scope thereof, and the scope thereof is determined by the claims that follow.

What is claimed is:
1. A substrate processing system, the system comprising:
a substrate support assembly disposed within a processing chamber;
a bias electrode disposed within the substrate support assembly;
a pulse voltage waveform generator configured to deliver a pulse voltage waveform to the bias electrode;

a support base operable as a radio frequency (RF) electrode;
a RF generator assembly electrically coupled to the support base;
a controller coupled to the pulse voltage waveform generator and the RF generator assembly, wherein the controller comprises a plurality of pulsers and at least one synchronization pulser, the at least one synchronization pulser configured to transmit a synchronization signal; and
a memory for storing a program that is configured to provide instructions, which when executed by the controller, cause the pulse voltage waveform to be generated, wherein the pulse voltage waveform comprises a plurality of asymmetric voltage pulses.

2. The substrate processing system of claim 1, wherein the plurality of pulsers comprises a first pulser configured to provide a first transistor-transistor logic (TTL) input signal and a second pulser configured to provide a second TTL input.

3. The substrate processing system of claim 1, wherein the program is configured to provide instructions, which when executed by the controller, cause the pulse waveform generator to generate the pulse voltage waveform, the pulse voltage waveform comprises a plurality of pulse voltage micropulses.

4. The substrate processing system of claim 3, wherein the plurality of pulse voltage micropulses correspond to the plurality of pulsers.

5. The substrate processing system of claim 1, wherein the program is configured to provide instructions, which when executed by the controller, cause the synchronization pulser to generate the synchronization signal, the synchronization signal comprises a pulse-on delay wherein no pulses are delivered to the bias electrode.

6. The substrate processing system of claim 1, wherein the program is configured to provide instructions, which when executed by the controller, cause the synchronization pulser to generate the synchronization signal, the synchronization signal comprises a pulse-end delay wherein no pulses are delivered to the bias electrode.

7. The substrate processing system of claim 1, wherein the program is configured to provide instructions, which when executed by the controller, cause the plurality of pulsers comprising a first pulser configured to provide a first transistor-transistor logic (TTL) input signal and a second pulser configured to provide a second TTL input, wherein the pulse voltage waveform comprises a plurality of pulse voltage micropulses, the plurality of pulse voltage micropulses comprising of a plurality of first pulse voltage micropulses corresponding to the first TTL input signal and a plurality of second pulse voltage micropulses corresponding to the second TTL input, and wherein the plurality of pulse voltage micropulses are delivered to the bias electrode according to the synchronization signal.

8. The substrate processing system of claim 7, wherein the program is configured to provide instructions, which when executed by the controller, cause the synchronization pulser to generate the synchronization signal, the synchronization signal comprises a pulse-on delay and a pulse-end delay wherein no pulse voltage micropulses are delivered to the bias electrode.

9. The substrate processing system of claim 7, wherein each of the plurality of second pulse voltage micropulses is interleaved between each of the plurality of first pulse voltage micropulses.

10. The substrate processing system of claim 1, further comprising:
an edge control electrode disposed within the substrate support assembly disposed within an edge ring; and
a second pulse voltage waveform generator configured to deliver a second pulse voltage waveform to the edge control electrode.

11. The substrate processing system of claim 1, further comprising a DC power supply electrically coupled to the bias electrode.

12. A processing system, the processing system comprising:
a processing chamber;
a pulsed voltage waveform generator configured to deliver a pulsed voltage waveform to a bias electrode assembly disposed within the processing chamber, wherein the pulse voltage waveform comprises a plurality of asymmetric voltage pulses;
a radio frequency (RF) generator configured to deliver RF power to a support base;
a controller; and
a memory for storing a program to be executed in the controller, the program comprising instructions that cause the voltage waveform generator to:
receive, by a waveform generator, a first transistor-transistor logic (TTL) input signal from a first pulser of a plurality of pulsers and a synchronization signal from the controller; and
deliver, by the waveform generator, a first pulse voltage micropulse to the bias electrode disposed in a substrate support assembly within the processing system after receiving the first TTL input signal and the synchronization signal.

13. The processing system of claim 12, wherein the instructions are configured to further cause the voltage waveform generator to:
receive, by the waveform generator, a second TTL input signal from a second pulser of the plurality of pulsers and the synchronization signal from the controller; and
deliver, by the waveform generator, a second pulse voltage micropulse to the bias electrode disposed in the substrate support assembly within the processing system after receiving the second TTL input signal and the synchronization signal.

14. The processing system of claim 13, wherein the first pulse voltage micropulse comprises a plurality of first pulse voltage micropulses, wherein the second pulse voltage micropulse comprises a plurality of second pulse voltage micropulses, each of the plurality of second pulse voltage micropulses interleaved between each of the plurality of first pulse voltage micropulses.

15. The processing system of claim 13, wherein the instructions for the synchronization signal comprise a plurality of synchronization signals and wherein the instructions are configured to cause the waveform generator to deliver the first pulse voltage micropulse and the second pulse voltage micropulse when the plurality of synchronization signals overlap.

16. The processing system of claim 13, wherein the first pulse voltage micropulse comprises a plurality of first pulse voltage micropulses, the second pulse voltage micropulse comprises a plurality of second pulse voltage micropulses.

17. The processing system of claim 16, wherein each of the plurality of second pulse voltage micropulses is interleaved between each of the plurality of first pulse voltage micropulses.

18. The processing system of claim 12, further comprising:
- an edge control electrode disposed within the substrate support assembly disposed within an edge ring; and
- a second pulse voltage waveform generator configured to deliver a second pulse voltage waveform to the edge control electrode.

19. The processing system of claim 12, further comprising a DC power supply electrically coupled to the bias electrode.

* * * * *